US010453647B2

(12) United States Patent
Mohammadi-Gheidari et al.

(10) Patent No.: US 10,453,647 B2
(45) Date of Patent: Oct. 22, 2019

(54) EMISSION NOISE CORRECTION OF A CHARGED PARTICLE SOURCE

(71) Applicant: FEI Company, Hillsboro, OR (US)

(72) Inventors: Ali Mohammadi-Gheidari, Best (NL); Luigi Mele, Eindhoven (NL); Peter Christiaan Tiemeijer, Eindhoven (NL); Gerard Nicolaas Anne van Veen, Waalre (NL); Hendrik Nicolaas Slingerland, Venlo (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 15/435,018

(22) Filed: Feb. 16, 2017

(65) Prior Publication Data
US 2018/0233322 A1 Aug. 16, 2018

(51) Int. Cl.
*H01J 37/22* (2006.01)
*H01J 37/20* (2006.01)
(Continued)

(52) U.S. Cl.
CPC ............ *H01J 37/222* (2013.01); *H01J 37/20* (2013.01); *H01J 37/243* (2013.01);
(Continued)

(58) Field of Classification Search
CPC ...... H01J 3/20; H01J 3/222; H01J 3/24; H01J 3/244; H01J 3/28; H01J 3/26; H01J 37/20;
(Continued)

(56) References Cited

U.S. PATENT DOCUMENTS 3,783,281 A * 1/1974 Crewe ................... H01J 37/244
250/307
3,872,287 A * 3/1975 Koeman ................... G01T 1/36
250/336.1
(Continued)

OTHER PUBLICATIONS

"Electron Microscope", Wikipedia, Retrieved from the Internet Oct. 15, 2015, http://en.wikipedia.org/wiki/Electron_microscope, 11 pages.
(Continued)

*Primary Examiner* — David E Smith
(74) *Attorney, Agent, or Firm* — Denton W. McAlister

(57) ABSTRACT

A method of operating a charged particle microscope comprising the following steps:
  Providing a specimen on a specimen holder;
  Using a source to produce a beam of charged particles that is subject to beam current fluctuations;
  Employing a beam current sensor, located between said source and specimen holder, to intercept a part of the beam and produce an intercept signal proportional to a current of the intercepted part of the beam, the beam current sensor comprising a hole arranged to pass a beam probe with an associated probe current;
  Scanning said probe over the specimen, thereby irradiating the specimen with a specimen current, with a dwell time associated with each scanned location on the specimen;
  Using a detector to detect radiation emanating from the specimen in response to irradiation by said probe, and producing an associated detector signal;
  Using said intercept signal as input to a compensator to suppress an effect of said current fluctuations in said detector signal,
wherein:
  The beam current sensor is configured as a semiconductor device with a sensing layer that is oriented toward the source, in which:
(Continued)

Figure 1:
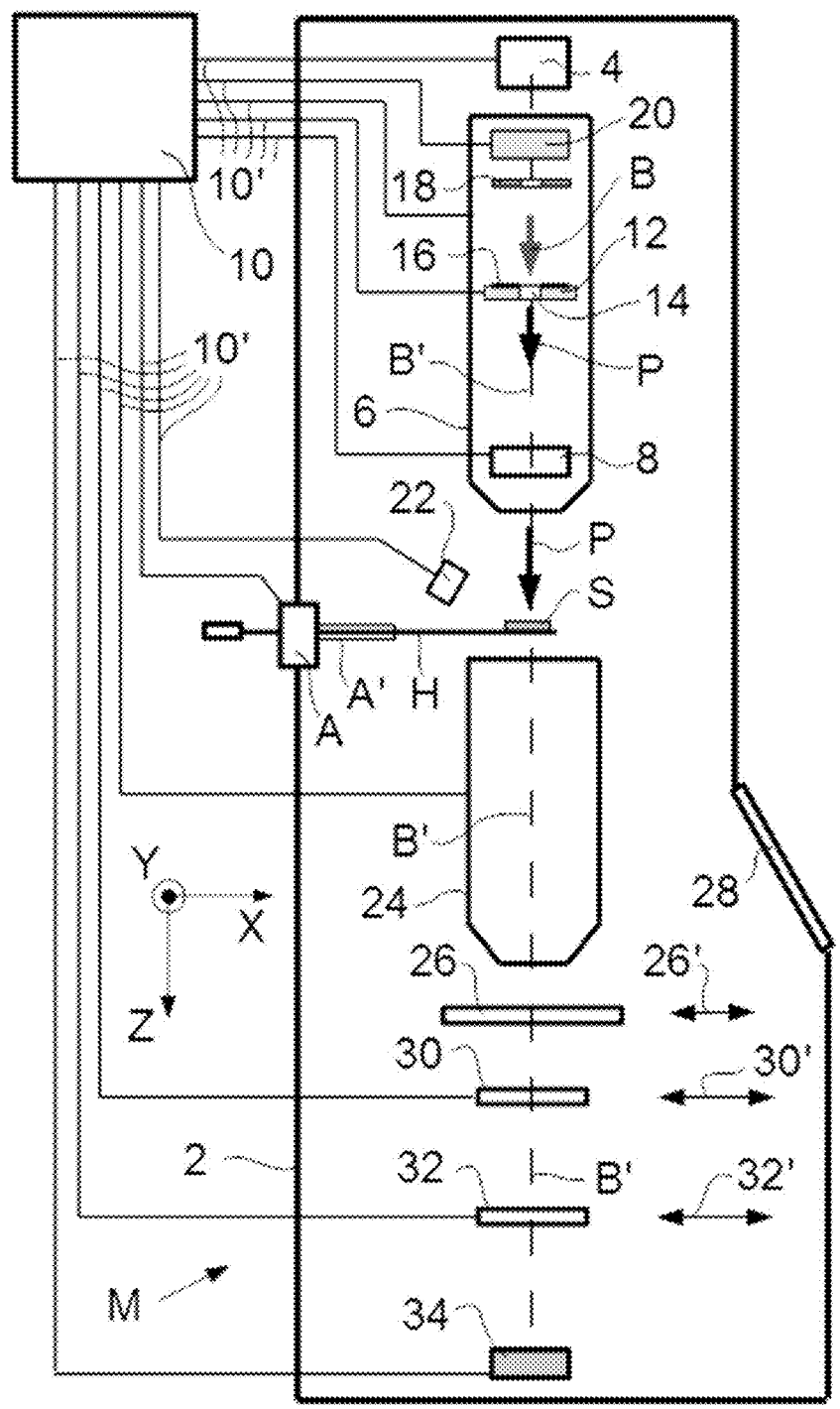

Each charged particle of said intercepted part of the beam generates electron/hole pairs in said sensing layer;

Generated electrons are drawn to an anode of the semiconductor device;

Generated holes are drawn to a cathode of the semiconductor device, thereby producing said intercept signal.

22 Claims, 2 Drawing Sheets

(51) Int. Cl.
 *H01J 37/244* (2006.01)
 *H01J 37/24* (2006.01)
(52) U.S. Cl.
 CPC ..... *H01J 37/244* (2013.01); *H01J 2237/2441* (2013.01); *H01J 2237/24535* (2013.01)
(58) Field of Classification Search
 CPC ........ H01J 37/222; H01J 37/24; H01J 37/244; H01J 37/28; H01J 37/26
 See application file for complete search history.

(56) References Cited

U.S. PATENT DOCUMENTS

| | | | | |
|---|---|---|---|---|
| 4,559,450 A | * | 12/1985 | Robinson | G01N 23/203 250/307 |
| 4,990,778 A | | 2/1991 | Norioka | |
| 7,091,486 B1 | * | 8/2006 | McCord | B82Y 10/00 250/306 |
| 7,615,747 B1 | * | 11/2009 | Brodie | H01J 37/22 250/310 |
| 8,653,457 B2 | | 2/2014 | Stoks | |
| 8,735,849 B2 | * | 5/2014 | Hlavenka | H01J 37/244 250/397 |
| 2008/0315094 A1 | * | 12/2008 | Wang | H01J 37/244 250/310 |
| 2011/0163229 A1 | * | 7/2011 | Frosien | H01J 37/05 250/310 |
| 2013/0332116 A1 | * | 12/2013 | Suzuki | G06F 17/18 702/191 |
| 2015/0034835 A1 | | 2/2015 | Matsunaga et al. | |
| 2016/0056015 A1 | | 2/2016 | Veen et al. | |

OTHER PUBLICATIONS

"Focused Ion Beam", Wikipedia, Retrieved from the Internet Jul. 11, 2016, https://en,wikipedia.org/wiki/Focused_ion_beam, 7 pages.
"Scanning Electron Microscope", Wikipedia. Retrieved from the Internet Jul. 25, 2016, http://en.wikipedia.org/wiki/Scanning_electron_microscope, 23 pages.
"Scanning Helium Ion Microscope", Wikipedia, Retrieved from the Internet on Jul. 25, 2016, http://en.wikipedia.org/wiki/Scanning_Helium_Ion_Microscope, 2 pages.
"Scanning Transmission Electron Microscopy", Wikipedia, Retrieved from the Internet Jul. 25, 2016, http://en.wikipedia.org/wiki/Scanning_transmission_electron_microscopy, 5 pages.
"Transmission Electron Microscopy", Wikipedia, Retrieved from the Internet Jul. 25, 2016, http://en.wikipedia.org/wiki/Transmission_ electron_ microscopy, 23 pages.
Escovitz, W.H. et al., "Scanning Transmission Ion Microscope with a Field Ion Source," Proc. Nat. Acad. Sci. USA, May 1975, pp, 1320-1328, vol. 72, No. 5.
Timischl, F., et al., ., "A statistical model of signal-noise in scanning electron microscopy", Wiley Online Library, Scanning vol. 34, (2012) issue 3, pp. 137-144.
Varentsov, D. et al. "First biological images with high-energy proton microscopy", Physical Medica (2013), pp. 208-213, vol. 29.

* cited by examiner

EMISSION NOISE CORRECTION OF A CHARGED PARTICLE SOURCE

The invention relates to a method of operating a charged particle microscope comprising the following steps:
- Providing a specimen on a specimen holder;
- Using a source to produce a beam of charged particles that is subject to beam current fluctuations;
- Employing a beam current sensor, located between said source and specimen holder, to intercept a part of the beam and produce an intercept signal proportional to a current of the intercepted part of the beam, the beam current sensor comprising a hole arranged to pass a beam probe with an associated probe current;
- Scanning said probe over the specimen, thereby irradiating the specimen with a specimen current, with a dwell time associated with each scanned location on the specimen;
- Using a detector to detect radiation emanating from the specimen in response to irradiation by said probe, and producing an associated detector signal;
- Using said intercept signal as input to a compensator to suppress an effect of said current fluctuations in said detector signal.

The invention also relates to a charged particle microscope in which such a method can be enacted.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
- en.wikipedia.org/wiki/Electron_microscope
- en.wikipedia.org/wiki/Scanning_electron_microscope
- en.wikipedia.org/wiki/Transmission_electron_microscopy
- en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
- en.wikipedia.org/wiki/Focused_ion_beam
- en.wikipedia.org/wiki/Scanning_Helium_Ion_Microscope
- W. H. Escovitz, T. R. Fox and R. Levi-Setti, *Scanning Transmission Ion Microscope with a Field Ion Source*, Proc. Nat. Acad. Sci. USA 72(5), pp. 1826-1828 (1975). www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:
- A particle source, such as a Schottky electron source or ion source.
- An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder will comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (arranged vertically) will be used to image the specimen, and an ion column (arranged at an angle) can be used to (concurrently) modify (machine/process) and/or image the specimen, whereby the specimen holder can be positioned in multiple degrees of freedom so as to suitably "present" a surface of the specimen to the employed electron/ion beams.

In the case of a transmission-type microscope (such as a (S)TEM, for example), a CPM will specifically comprise:
- An imaging system (imaging particle-optical column), which essentially takes charged particles that are transmitted through a specimen (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

As already indicated above, the term "probe" is often used to refer to the (narrow) beam at the location of the specimen (because the specimen is "probed" by the beam).

In what follows, the invention may—by way of example—sometimes be set forth in the specific context of electron microscopy; however, such simplification is intended solely for clarity/illustrative purposes, and should not be interpreted as limiting.

A charged particle microscope, such as a SEM or STEM, preferably employs a high brightness source. In the case of electrons, one such source is a Cold Field Emission source (also referred to as a Cold Field Emission Gun or CFEG). For such a source, the source size is very small and therefore the brightness is very high, and since the source is operated at room temperature (or a temperature close thereto) minimal thermal energy spread is introduced. A similar source producing ions is a Liquid Metal Ion Source, for example.

A problem with a source with a small emittance area, such as a CFEG, is that the charged particles are emitted from an area with a diameter of only several atoms. If gas is adsorbed to some of these emitting atoms, this severely changes the emission of such a source, resulting in so-called flicker noise. Therefore, such a source is conventionally operated at a very high vacuum (for example better than $10^{-10}$ mbar). However, current fluctuations are still a well-known problem for these sources. It is noted that such sources also show Poisson noise due to the statistical variation in the number of charged particles emitted.

U.S. Pat. No. 3,783,281 describes a method for countering the effect of current fluctuations. This patent describes a SEM equipped with a CFEG, which produces a beam of electrons having current fluctuations. A probe is formed from the beam by passing the beam through an aperture, and this probe is scanned over a specimen, causing secondary radiation to emanate from the specimen. An image detector generates an image signal proportional to said secondary radiation, and this signal is used to generate an image on a display. As the signal emanating from the sample is proportional to the probe current, fluctuations in the probe current cause intensity fluctuations in the image signal, and thus the image. To reduce the fluctuations in the image due to probe current fluctuations, a reference signal is generated proportional to an intercepted part of the beam current striking an intercept aperture. Said intercepted part of the beam generates secondary electrons (SEs) and backscattered electrons (BSEs) from the intercepted portion of the intercept aperture, and these SEs and BSEs are detected using an Everhart-Thornley detector (ET detector), resulting in said intercept signal. The image signal is first processed by a first logarithmic amplifier to produce a first logarithmic signal, the intercept signal is processed by a second logarithmic amplifier producing a second logarithmic signal, the two logarithmic signals are subtracted, and the subtracted signal is then processed by an anti-logarithmic amplifier. The resultant signal is proportional to the image signal multiplied by the intercept signal, thereby reducing the effect of the beam current fluctuations. The intercept aperture is irradiated with a beam with a diameter of 200 μm and has a central hole of 100 μm, so that the described embodiment has an intercept current ca. three times larger than the probe current.

A noise model for a system using an ET detector is described in the journal article by F. Timischl et al., "A statistical model of signal-noise in scanning electron microscopy", Scanning vol. 33, 1-8 (2011). This Timischl article discusses the noise of a system using an ET detector, employing a 5-stage noise model: noise in the probe, noise added by the conversion to SEs, noise added by the conversion to photons, noise added by the conversion to photoelectrons, and noise added by the electron multiplication in the dynodes of the PMT (photo-multiplier tube) in the ET detector. For the source, the Timischl article assumes a Poisson contribution. As already mentioned, such a simplification is not appropriate in the case of, for example, a CFEG, which exhibits both Poisson noise and flicker noise.

Present STEMs and SEMs use a beam current typically in a range of ca. 10-100 pA (sometimes 1-1000 pA) and a dwell time of typically ca. 10 μs (sometimes 0.1-1000 μs) per pixel. This implies, for example, a number of electrons of 624 electrons per pixel, and thus a Poisson noise of 25 electrons (signal-to-noise (S/N) ratio=2.4×≈8 dB). For the Poisson noise of the ET detector chain to become equal, the intercept current multiplied by the secondary electron emission coefficient should equal the probe current. As known to the skilled artisan, the SE yield δ for a polished metal plate and using electrons with a primary energy of 10 keV or more is between 0.1 and 0.5. The yield for backscattered electrons is even lower. Therefore, for a set-up where the probe current is shot-noise limited and the intercepted current is measured with a set-up as described in the aforementioned patent U.S. Pat. No. 3,783,281, the intercepted current must be at least 2 to 5 times higher than the probe current. Another drawback is the relatively high cost (and bulkiness) associated with the use of an ET detector. Yet another problem with a system employing anti-log and log amplifiers is that, by their very nature, they tend to add extra noise.

Another method to correct emission noise by measuring an intercept current is described in U.S. Pat. No. 4,990,778. Here it is proposed to intercept the current using a metal plate and to measure the current intercepted using a current-to-voltage convertor. The intercept voltage is then used as an input signal for the detector, thus countering the effect of probe current fluctuations. However, a problem with this method is that thermal noise is introduced by the current-to-voltage convertor. Also, secondary electrons leaving the intercept plate show up as noise, as the current of the secondary electrons is subtracted from the measured current, adding a statistical component and lowering the measured current, and thus lowering the signal.

Therefore, a common problem with the prior-art methods described above is that they suffer from S/N problems, and do not perform well when using a low beam current.

It is an object of the invention to address these issues. More specifically, it is an object of the invention to provide a fluctuation-correcting method/apparatus that achieves a more satisfactory signal-to-noise ratio, especially at relatively low probe currents, e.g. in a range 10-100 pA (picoamps).

These and other objects are achieved in a method as set forth in the opening paragraph above, wherein the beam current sensor is configured as a semiconductor device with a sensing layer that is oriented toward the source, in which:

Each charged particle of said intercepted part of the beam generates electron/hole pairs in said sensing layer;

Generated electrons are drawn to an anode of the semiconductor device;

Generated holes are drawn to a cathode of the semiconductor device, thereby producing said intercept signal.

During extensive experimentation and analysis leading to the invention, the inventors came to the conclusion that the limiting effects of noise in methods such as those set forth in the abovementioned U.S. Pat. Nos. 3,783,281 and 4,990,778 can be substantially mitigated/eliminated if one employs an electron/hole-pair-based sensor. A particular problem in said prior-art methods is the noise contribution of the secondary electron coefficient δ; in contrast, in the present invention, even if (inadvertent) SE/BSE generation occurs in the sensing layer of the inventive beam current sensor, a sufficiently large number of electron/hole pairs is still generated to yield a good S/N ratio. Overall, a detector that exploits electron/hole generation has a higher probability of unambiguous detection/fewer issues with so-called detector pile-ups (see below).

It should be noted that the accurate provision of a small, well-defined hole (typically with a diameter of the order of a few hundred microns) in a semiconductor sensor is a non-trivial undertaking. This is inter alia because so-called "edge effects" tend to become significant: the edges of the hole tend to have dangling Si (or other semiconductor) atoms as an artefact of the (etching) process used to create the hole, and these tend to work as parasitic charge generation/recombination centers. Due to the proximity of the sensor's PN junction to these edges, the depletion region can extend to the edge of the aperture, thus leading to a potentially (very) high leakage current. In order to mitigate this effect, the sidewalls of the hole can be passivated, e.g. with a highly-doped P-type region (a so-called "pinning layer"). It can be a challenge to implant this layer (e.g. comprising Boron) on the sidewalls of a narrow cavity/hole, but the inventors have overcome this challenge by performing ion implantation at an angle, e.g. of ca. 5-10° from normal (to the plane of the sensing layer).

An advantageous embodiment of the invention has the following functionality:
  A beam footprint adjusting element is provided between the source and the beam current sensor, which element comprises a beam defining aperture;
  Said element is configured to define a diameter of the beam impinging on the beam current sensor.

An important basis for such an embodiment is the insight by the inventors that, in general, there is not a one-to-one correlation between the current in the intercepted part of the beam and the probe current. Surprisingly, the inventors discovered that the current in the outer regions of the intercepted beam correlated relatively poorly/erratically with the probe current, and also that these outer regions were subject to the greatest flicker noise. Accordingly, the inventors concluded that best correlation (and highly reduced noise effects) could be achieved if one curtailed the diameter of the intercepted part of the beam —thereby selectively concentrating on its innermost regions. This can be achieved using a beam defining aperture (or plurality of such apertures), which only passes a relatively small beam footprint onto the inventive beam current sensor. This effect can be augmented using an upstream particle-optical lens (or plurality of lenses), whose excitation can be adjusted so as to "pinch" the transmitted beam as desired.

A possible explanation for the effect set forth in the previous paragraph is that the flicker noise is associated with stochastic variations in the angular distribution of charged particles within the beam, and that variations at a relatively large angle (outer regions of beam current sensor) are less frequent/more erratic than those at a relatively low angle (inner regions of beam current sensor). Without this knowledge, one might intuitively wish to register as much of the intercepted beam as possible—since, in general, more signal would be considered to render a better S/N ratio. However, it is now realized that registering the outer regions of the intercepted beam actually works counter-productively, by unexpectedly introducing greater noise. A problem with prior-art techniques such as those described above is that, when the diameter of the intercepted beam is curtailed in this manner, there is not enough signal (current) collected to give a satisfactory S/N performance; on the other hand, a semiconductor-based current sensor according to the present invention can still yield a satisfactory S/N ratio for such small beam diameters/currents, because of its fundamentally different detection mechanism. To give an example for guidance purposes: the present invention works well when the intercepted current is less than twice the probe current, whereas such a current ratio yields poor performance in the prior art.

As regards the manner in which the compensator uses the intercept signal to suppress the effects of source flicker, there are various options, which can be broadly sub-categorized into "real time" and "retrospective". In the former (real time) category, one can, for example, make a distinction between using the intercept signal to perform (one or more of):
  (i) Modulation of the scanning dwell time;
  (ii) Adjustment of a response of the detector;
  (iii) Duty-cycle modulation of the source.
These approaches can be further elucidated as follows:
  (i) The total radiation "dose" delivered to a given scan pixel is the (integrated) product of current (intensity) and dwell time. If the current rises or falls (due to flicker noise), then the dwell time can be inversely shortened or lengthened, so as to maintain an essentially constant product. In practice, an intercept current measured during a scan of pixel $p_n$ can, for example, be used to pre-determine/adjust a dwell time for a subsequent pixel $p_{n+1}$.
  (ii) In a somewhat similar fashion, if the current rises or falls (due to flicker noise), then the response (e.g. gain) of the detector can be inversely reduced or increased so that the product of these two quantities remains essentially constant. Once again, an intercept current measured during a scan of pixel $p_n$ can, for example, be used to pre-determine/adjust a detector response for a subsequent pixel $p_{n+1}$.
  (iii) Instead of "reactive" strategies (i) and (ii), one can also conceive a more "proactive" strategy, whereby flicker behavior is addressed at the source itself, e.g. by decreasing/increasing a source extractor voltage for a subsequent pixel $p_{n+1}$ in reaction to an increase/decrease in intercept current registered during a scan of a previous pixel $p_n$.

All of these strategies will, for example, benefit from the use of fast processing circuitry and fast buses (e.g. fiber optic links), so as to minimize the reaction time associated with a measured fluctuation in intercept current. On the other hand, if one adopts a retrospective (ex post facto) corrective approach, there is no equivalent need for fast processing/buses—since, in this scenario, data are accumulated and stored in raw form, and are subsequently processed/reworked at leisure. In this category of retrospective correction, an advantageous approach is, for example, the following:

The detector signal is assembled pixel-wise into a raw image;

The intercept signal is assembled pixel-wise into a flicker map;

The compensator uses said flicker map to perform pixel-wise correction of said raw image.

In such a scenario, the flicker map effectively acts as a pixel-wise (digital) "filter" that is used to manipulate/correct each pixel of the (digital) raw image.

In another embodiment of the invention:

The beam current sensor is one of a plurality of beam current sensors disposed on a carrier;

An actuator mechanism is used to move a selectable one of said plurality into a path of said beam.

Various sensors on the carrier may be:

Mutually identical, allowing a fallback/reserve sensor to be deployed in case a currently deployed member of the plurality reaches its end-of-lifetime (e.g. due to etching effects); and/or Mutually different, e.g. as regards the diameter of the hole through which the probe passes.

The actuator mechanism can make translatory and/or rotary movements, e.g. with the aid of a stepper motor, piezoelectric actuator, etc. In such a situation, the coordinates of the (centers of the) various sensors on the carrier can be stored in a lookup table, allowing the actuator mechanism to rapidly position a given sensor in the beam path when required.

In an advantageous embodiment of the invention, the beam current sensor's semiconductor device comprises an in situ amplifier. Such an architecture further helps to reduce noise, by eliminating (relatively long) transmission lines (which can act as noise antennae) between the semiconductor device and an ex situ amplifier. In addition, an in situ amplifier contributes to more rapid processing of the intercept signal, and is thus advantageous in the context of the "real time" compensation strategies discussed above, for example.

In a particular embodiment of the invention, the sensing layer of the beam current sensor is segmented or pixelated (i.e. is sub-divided into a plurality of individual detection sub-regions). Such an architecture has several associated advantages, such as:

The ability to extract angularly-resolved information from the intercepted part of the beam, e.g. the current in the outer intercepted regions versus the current in the inner intercepted regions. Such information is useful in deciding/tuning which part of the intercepted beam gives best correlation with the non-intercepted probe (see the discussion above). This will particularly be so in the case of pixelation or segmentation into a nested set of annular zones, for example.

As an extension of the previous point, segmentation/pixelation allows the option of ignoring signals coming from outer regions of the intercepted beam—thus allowing concentration on the inner intercepted regions. One thus achieves a similar effect as the aforementioned beam footprint adjusting element—acting as a supplement to/or replacement for that element.

The chance of so-called detection pile-ups is decreased: if one detection sub-division has just registered an incoming charged particle and hasn't yet reset itself, there will still be a multiplicity of other detection sub-divisions ready to detect a subsequent incoming charged particle. There is therefore a reduced chance of "lost data", e.g. because a short train of closely-spaced incoming particles can now be resolved rather than being erroneously registered as a single event. The phenomenon of data pile-ups is described in more detail in U.S. Pat. No. 8,653,457, for example (same assignee as the present invention).

Associated with the reduced risk of "lost data" is an improvement in the expected S/N ratio.

An advantageous example of a pixelated beam current sensor as alluded to in the previous paragraph is a Solid State Photo-Multiplier (SSPM)—also sometimes referred to as Multi-Pixel Photon Counter (MPPC®)—which is a pixelated array of avalanche photodiodes: see, for example, U.S. Pat. No. 8,735,849 (same assignee as the present invention). Other types of sensor that lend themselves to use as/in the inventive beam sensor include, for example, photodiodes (regular and/or avalanche photodiodes), CCDs (Charge-Coupled Devices), CMOS (Complementary Metal Oxide Semiconductor) detectors, and STEM cameras. If desired, a radiation-hardening shield (such as a Boron(-doped) layer) may be employed in the chosen detector. The skilled artisan will be able to choose a sensor type that is best suited to the particulars of a given detection set-up.

Ideally, the beam current sensor of the present invention will concurrently fulfil the role of Beam-Limiting Aperture (BLA)—an aperture plate that is conventionally present upstream of the specimen to define the footprint/acceptance angle of the probe that impinges thereon. However, if desired, a (switchable) separate/distinct/dedicated BLA may be disposed between the inventive beam current sensor and the specimen, e.g. to mitigate potential quality concerns pertaining to the hole in the beam current sensor (due to use-associated etching effects, for instance), or simply to allow independent adjustment of the beam at specimen level.

As already referred to above, the present invention is particularly advantageous when the employed source is a CFEG. However, this is not the only type of source that can be used with the invention, and other source types include, for example, an electron impact ionization source [of which a particular form is a Nano Aperture Ion Source (NAIS)], a Liquid Metal Ion Source (LMIS) [already alluded to above], and a field ionization source. Because ions are much heavier than electrons, one can expect an ion beam to more aggressively etch the edges of the hole in the inventive beam current sensor; however, this does not necessarily have to be a problem, e.g. in view of the exchanger mechanism described above (multiple sensors on an actuated carrier), which easily allows a worn sensor to be swapped out when it has reached end-of-lifetime.

The skilled artisan will realize that the present invention can be applied in a SEM, a STEM, a FIB-SEM, and various other types of CPM.

The invention will now be elucidated in more detail on the basis of exemplary embodiments and the accompanying schematic drawings, in which:

FIG. 1 renders a longitudinal cross-sectional view of an embodiment of a CPM in which the present invention is implemented.

Figure 2:
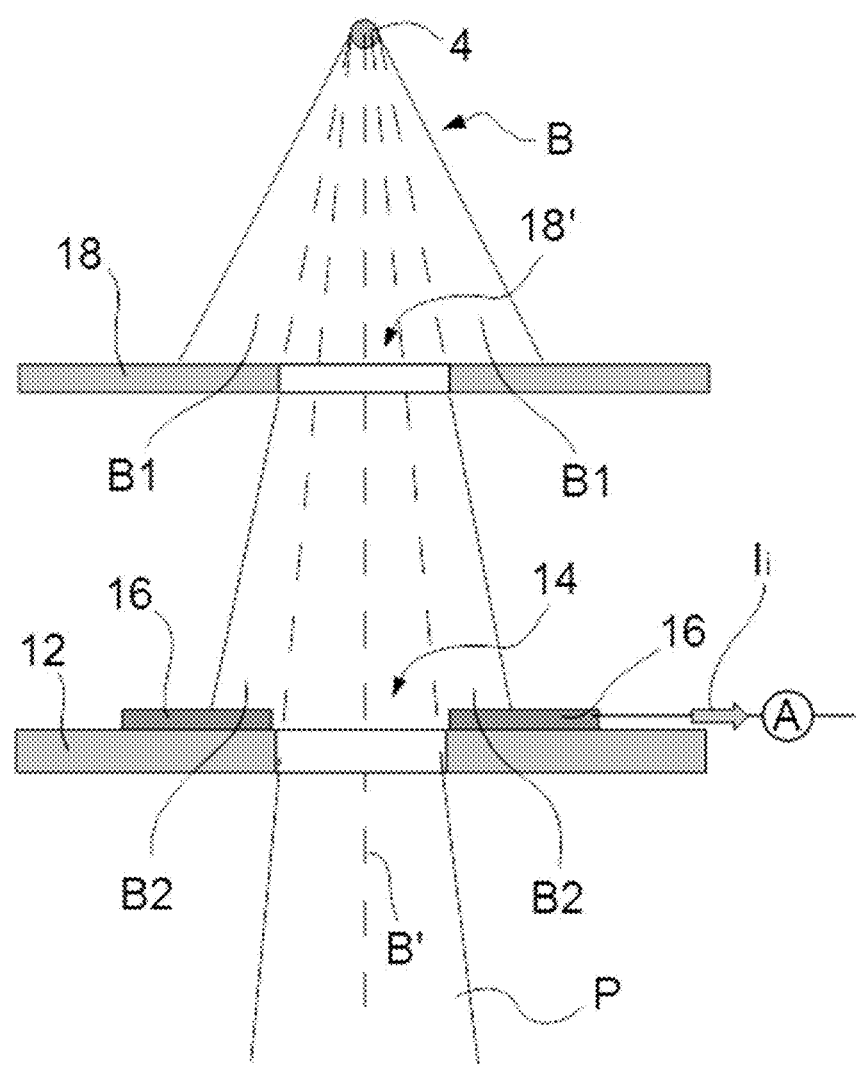

FIG. 2 shows a magnified view of a portion of FIG. 1.

In the Figures, where pertinent, corresponding parts are indicated using corresponding reference symbols. It should be noted that, in general, the Figures are not to scale.

Embodiment 1

FIG. 1 is a highly schematic depiction of an embodiment of a charged-particle microscope M in which the present invention is implemented; more specifically, it shows an embodiment of a transmission-type microscope M, which, in this case, is a TEM/STEM (though, in the context of the current invention, it could just as validly be a SEM, or an ion-based microscope, for example). In the Figure, within a vacuum enclosure 2, a CFEG electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). This illuminator 6 comprises (scan) deflector(s) 8, and will also generally comprise a variety of electrostatic/magnetic lenses, correctors (such as stigmators), etc.; typically, it can also comprise a condenser system (the whole of item 6 is sometimes referred to as "a condenser system"). The beam B impinges upon the specimen S as a probe P (discussed in more detail below).

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be irradiated/imaged/inspected by the electron probe P traveling along axis B' (in the Z direction) (and/or allows scanning motion to be performed, as an alternative to probe scanning). If desired, an optional cooling device (not depicted) can be brought into intimate thermal contact with the specimen holder H, so as to maintain it (and the specimen S thereupon) at cryogenic temperatures, for example.

The electron probe P will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 10 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the probe P on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example (EELS=Electron Energy-Loss Spectroscopy).

It should be noted that the order/location of items 30, 32 and 34 is not strict, and many possible variations are conceivable. For example, spectroscopic apparatus 34 can also be integrated into the imaging system 24.

Note that the controller (computer processor) 10 is connected to various illustrated components via control lines (buses) 10'. This controller 10 can provide a variety of functions, such as synchronizing actions, providing setpoints, processing signals, performing calculations, and displaying messages/information on a display device (not depicted). Needless to say, the (schematically depicted) controller 10 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam/probe passes, but widening out to accommodate structures such as the source 4, specimen holder H, screen 26, camera 30, camera 32, spectroscopic apparatus 34, etc.

In the specific context of the current invention, the microscope M comprises a beam current sensor 12, located between said source 4 and specimen holder H, to intercept a part B2 of the beam B and produce an intercept signal proportional to a current of this intercepted beam part B2 (see FIG. 2). The beam current sensor 12 comprises a hole (aperture/opening) 14 that is arranged to pass (and define) the aforementioned beam probe P, which has an associated probe current. This beam current sensor 12 is configured as a semiconductor device with a sensing layer 16 that is oriented toward the source S (i.e. toward the incoming beam), such that:

Each charged particle of said intercepted part B2 of the beam B generates electron/hole pairs in said sensing layer 16;

Generated electrons are drawn to an anode (not shown) of the semiconductor device;

Generated holes are drawn to a cathode (not shown) of the semiconductor device, thereby producing said intercept signal $I_t$. This intercept signal $I_t$ can then be used as input to processor 10 (or another compensator), which uses it to suppress the effects of current fluctuations (flicker) in the beam B, more specifically to correct an output (ultimately an image/diffractogram/spectrum) from one or more of detection devices 22, 30, 32, 34. This can be done using a "real time" and/or "retrospective" correction technique as set forth above, for example.

Also depicted in FIG. 1 is a beam footprint adjusting element 18, which is provided between the source S and the beam current sensor 12, and which comprises a beam defining aperture 18' (see FIG. 2). This element 18 is configured to define a diameter of the beam B impinging on the beam current sensor 12. Optionally/alternatively present is a lens 20, which can achieve a similar (diameter adjusting) effect by applying an adjustable pinch to the beam B.

Turning now to FIG. 2, this shows a magnified view of an upper portion of the subject of FIG. 1, but omits the lens 20 so as to avoid clutter. In the Figure, it is seen how a broad initial beam B from source 4 has its outermost (annular) regions B2 eclipsed/blocked by footprint adjusting element 18, with only an innermost portion proceeding through aperture 18'. This "clipped" beam then impinges upon beam current sensor 12, where it is further curtailed into probe P, with outer regions B2 being interrupted by the (sensing surface 16 on) sensor 12. As here embodied, the sensing surface 16 takes the form of an annular collar surrounding hole 14, but this need not necessarily be the case, and surface 16 could take other forms, such as:

A collection of segments of an annulus surrounding hole 14;

A pair (or several pairs) of detection spots diametrically opposed on opposite sides of hole 14;

A single detection spot on one side of hole 14, etc. As explained above, "clipping" the beam B by removing its outer portions B1 ultimately results in better correlation of the current in the intercepted beam part B2 and the current in the probe P. Such "clipping" could also be achieved by curtailing an outer diameter of the sensing surface 16, for example.

To give a non-limiting example for guidance purposes:

Item 12 may comprise a Si substrate with a thickness in a range of ca. 500-600 μm, for instance.

Sensing layer 16 may have a thickness of ca. 20-80 μm, deposited (in iterations) on substrate 12 using a physical and/or chemical vapor deposition technique, for instance. Its outer diameter may be ca. 500 μm, for instance.

Hole 14 may have a diameter in a range of ca. 50-150 μm, for instance.

The invention claimed is:

1. A method of operating a charged particle microscope, comprising:

providing a specimen on a specimen holder;

using a source to produce a beam of charged particles that is subject to beam current fluctuations;

employing a beam current sensor, located between said source and specimen holder, to intercept a part of the beam and produce an intercept signal proportional to a current of the intercepted part of the beam, the beam current sensor comprising a hole arranged to pass a beam probe with an associated probe current;

scanning said probe over the specimen, thereby irradiating the specimen with a specimen current, with a dwell time associated with each scanned location on the specimen;

using a detector to detect radiation emanating from the specimen in response to irradiation by said probe, and producing an associated detector signal; and using said intercept signal as input to a compensator to suppress an effect of said current fluctuations in said detector signal, wherein:

the beam current sensor is configured as a semiconductor device with a sensing layer that is oriented toward the source, in which:

each charged particle of said intercepted part of the beam generates electron/hole pairs in said sensing layer;

generated electrons are drawn to an anode of the semiconductor device; and generated holes are drawn to a cathode of the semiconductor device, thereby producing said intercept signal.

2. A method according to claim 1, in which:

a beam footprint adjusting element is provided between the source and the beam current sensor, which element comprises a beam defining aperture; and said element is configured to define a diameter of the beam impinging on the beam current sensor.

3. A method according to claim 2, in which defining said diameter comprises adjusting an excitation of a particle-optical lens disposed upstream of said aperture.

4. A method according to claim 1, in which said compensator uses said intercept signal to perform at least one of the following actions:

modulate said dwell time;

and perform duty-cycle modulation of said source.

5. A method according to claim 1, in which said beam current sensor is one of a plurality of beam current sensors disposed on a carrier; and an actuator mechanism is used to move a selectable one of said plurality into a path of said beam.

6. A method according to claim 3, in which said compensator uses said intercept signal to perform at least one of the following actions:

modulate said dwell time;

adjust a response of said detector; and perform duty-cycle modulation of said source.

7. A method according to claim 2, in which:

said detector signal is assembled pixel-wise into a raw image;

said intercept signal is assembled pixel-wise into a flicker map; and said compensator uses said flicker map to perform pixel-wise correction of said raw image.

8. A method according to claim 3, in which:

said detector signal is assembled pixel-wise into a raw image;

said intercept signal is assembled pixel-wise into a flicker map; and said compensator uses said flicker map to perform pixel-wise correction of said raw image.

9. A method according to claim 2, in which:
said beam current sensor is one of a plurality of beam current sensors disposed on a carrier; and
an actuator mechanism is used to move a selectable one of said plurality into a path of said beam.

10. The method of claim 1, in which using a source to produce a beam of charged particles that is subject to beam current fluctuations, comprises using a source to produce a beam having a beam current between 1 PA and 1000 pA.

11. The method of claim 10, in which using a source to produce a beam of charged particles that is subject to beam current fluctuations, comprises using a source to produce a beam having a beam current between 10 pA and 100 pA.

12. The method of claim 1, in which the hole in the beam current sensor has an opening of between 50 µm and 150 µm.

13. The method of claim 1, in which the side walls of the hole in the beam current sensor is passivated.

14. A method of providing a specimen on a specimen holder;
using a source to produce a beam of charged particles that is subject to beam current fluctuations;
employing a beam current sensor, located between said source and specimen holder, to intercept a part of the beam and produce an intercept signal proportional to a current of the intercepted part of the beam, the beam current sensor comprising a hole arranged to pass a beam probe with an associated probe current;
scanning said probe over the specimen, thereby irradiating the specimen with a specimen current, with a dwell time associated with each scanned location on the specimen;
using a detector to detect radiation emanating from the specimen in response to irradiation by said probe, and producing an associated detector signal; and
using said intercept signal as input to a compensator to suppress an effect of said current fluctuations in said detector signal,
wherein:
the beam current sensor is configured as a semiconductor device with a sensing layer that is oriented toward the source, in which:
each charged particle of said intercepted part of the beam generates electron/hole pairs in said sensing layer;
generated electrons are drawn to an anode of the semiconductor device; and
generated holes are drawn to a cathode of the semiconductor device, thereby producing said intercept signal,
in which:
said detector signal is assembled pixel-wise into a raw image;
said intercept signal is assembled pixel-wise into a flicker map; and
said compensator uses said flicker map to perform pixel-wise correction of said raw image.

15. A charged particle microscope comprising:
a source, for producing a beam of charged particles that is subject to beam current fluctuations;
a specimen holder, for holding a specimen;
a beam current sensor, located between said source and specimen holder, configured to intercept a part of the beam and produce an intercept signal proportional to a current of the intercepted part of the beam, the beam current sensor comprising a hole arranged to pass a beam probe with an associated probe current;
an illuminator, configured to scan the probe over the specimen, such that the probe irradiates the specimen with a specimen current and has a dwell time associated with each scanned location on the specimen;
a detector, for detecting radiation emanating from the specimen in response to irradiation by said probe, and producing an associated detector signal; and
a programmable controller, for automatically controlling given operations of the microscope,
wherein:
the beam current sensor comprises a semiconductor device with a sensing layer that is oriented toward the source, configured such that:
each charged particle of said intercepted part of the beam generates electron/hole pairs in said sensing layer;
generated electrons are drawn to an anode of the semiconductor device; and
generated holes are drawn to a cathode of the semiconductor device, thereby to produce said intercept signal; and
said controller is configured to use said intercept signal to suppress an effect of said current fluctuations in said detector signal.

16. A microscope according to claim 15, wherein said semiconductor device comprises an in situ amplifier.

17. A microscope according to claim 15, in which said sensing layer of the beam current sensor is segmented or pixelated.

18. A microscope according to claim 15, in which the beam current sensor is selected from the group consisting of a solid state photomultiplier, a photodiode, an avalanche photodiode, a CCD, a CMOS detector, and a STEM camera.

19. A microscope according to claim 15, in which a beam limiting aperture is disposed between the beam current sensor and the specimen, configured to define a diameter of the beam impinging on the specimen.

20. A microscope according to claim 15, in which said source is selected from the group consisting of a Cold Field Emitter Gun (CFEG), an electron impact ion source, a Nano Aperture Ion Source (NAIS), a Liquid Metal Ion Source (LMIS), and a field ionization source.

21. A microscope according to claim 16, in which said sensing layer of the beam current sensor is segmented or pixelated.

22. A microscope according to claim 16, in which the beam current sensor is selected from the group consisting of a solid state photomultiplier, a photodiode, an avalanche photodiode, a CCD, a CMOS detector, and a STEM camera.

* * * * *